United States Patent
Ueno et al.

(10) Patent No.: US 7,525,188 B2
(45) Date of Patent: Apr. 28, 2009

(54) MULTILAYER CIRCUIT BOARD AND PRODUCTION METHOD FOR SAME

(75) Inventors: Yukihiro Ueno, Hiroshima (JP); Keijiroh Edo, Hiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/447,194

(22) Filed: Jun. 6, 2006

(65) Prior Publication Data
US 2007/0063355 A1 Mar. 22, 2007

(30) Foreign Application Priority Data
Jun. 7, 2005 (JP) .............................. 2005-167525

(51) Int. Cl.
*H01L 23/04* (2006.01)

(52) U.S. Cl. ...................... 257/698; 257/701; 438/125

(58) Field of Classification Search ................ 257/698, 257/700, 701, 774; 438/118, 125
See application file for complete search history.

(56) References Cited

U.S. PATENT DOCUMENTS 5,384,181 A * 1/1995 Arthur et al. ............. 428/195.1
5,879,568 A * 3/1999 Urasaki et al. ................ 216/18
2005/0205297 A1* 9/2005 Suwa et al. .................. 174/257

FOREIGN PATENT DOCUMENTS

| JP | 10-190235 A | 7/1998 |
|----|-------------|--------|
| JP | 10-224040 A | 8/1998 |
| JP | 10-224041 A | 8/1998 |
| JP | 11-195853 A | 7/1999 |
| JP | 11-330310 A | 11/1999 |
| JP | 2002-94240 A | 3/2002 |
| JP | 2002-198653 A | 7/2002 |
| JP | 2002-237679 A | 8/2002 |
| JP | 2002-237680 A | 8/2002 |
| JP | 2003-319757 A | 1/2003 |
| JP | 2003-503832 A | 1/2003 |
| JP | 2004-164711 A | 5/2004 |
| WO | WO-01/01740 A1 | 1/2001 |

* cited by examiner

*Primary Examiner*—S. V Clark
(74) *Attorney, Agent, or Firm*—Birch, Stewart, Kolasch & Birch, LLP

(57) ABSTRACT

In a multilayer circuit board of the present invention, a plurality of circuit substrates configured by forming a circuit pattern on an insulating base material are stacked via an insulating layer, a through-hole and a via hole are formed in the layering direction, and laser processability and laser processing speed for a processing laser beam used in formation of the through-hole and the via hole are about the same for the insulating substrate material and the insulating layer.

12 Claims, 8 Drawing Sheets

MULTILAYER CIRCUIT BOARD AND PRODUCTION METHOD FOR SAME

BACKGROUND OF THE INVENTION

This application claims priority under 35 U.S.C. § 119(a) on Patent Application No. 2005-167525 filed in Japan on Jun. 7, 2005, the entire contents of which are hereby incorporated by reference.

The present invention relates to multilayer circuit boards in which a plurality of circuit substrates configured by forming a circuit pattern on an insulating base material are layered via an insulating layer, and in which a through-hole and a via hole are formed, and their method of production.

Conventionally, in hole formation processing of through-holes or via holes in a multilayer circuit board, a method using a carbonic acid gas laser or YAG laser is well known as a "laser via method", and is often used.

FIGS. 6 to 14 are schematic cross-sectional views that show an example of a production process for a multilayer circuit board using that "laser via method". That production process is described below.

First, as shown in FIG. 6, a layering substrate 201, which becomes a core, is formed by layering an inner conducting layer 102 configured from copper foil on both faces of an insulating base material 101 configured from an insulating resin substrate that becomes an inner insulating layer. Here, a fiberglass-reinforced epoxy resin substrate, a polyimide film, or the like is ordinarily used as the insulating base material 101.

Next, as shown in FIG. 7, a hole 103, which becomes a 2-3 interlayer inner via hole that connects the inner conducting layer 102 on both faces of the layer substrate 201, is formed.

Then, after appropriate preprocessing is performed, as shown in FIG. 8, a panel plating layer 104 is formed by performing panel plating processing on an entire layering substrate 202, which includes the hole 103 that becomes the 2-3 interlayer inner via hole.

Next, as shown in FIG. 9, an inner circuit is formed by etching the copper foil on both faces of a layer substrate 203 on which that panel plating has been performed, forming an inner circuit pattern 105 and a 2-3 interlayer inner via hole 106.

Afterward, as shown in FIG. 10, the 2-3 interlayer inner via hole 106 is filled with a filling resin 107.

As shown in FIG. 11, an interlayer insulating layer 108 configured from an insulating resin substrate and an outer conducting layer 109 configured from copper foil are layered in order on both faces of a layering substrate 204 that has been through the above processing, forming a multilayer substrate. Here, a prepreg that is a semi-hardened fiberglass-reinforced epoxy resin, or instead a combination of a suitable resin material and an adhesive, is ordinarily used as the insulating resin substrate.

Next, as shown in FIG. 12, in the above multilayer substrate, a portion of the outer conducting layer 109 where a via hole should be formed is removed by etching.

Then, a laser beam with an appropriate intensity and wavelength is irradiated on an interlayer insulating layer 111 at a location 110 where the copper foil of the outer conducting layer has been removed by the above etching. Thus, as shown in FIG. 13, a via hole 112 is formed by removing only the interlayer insulating layer 111 at the location 110 where the copper foil has been removed. Here, an interlayer insulating layer 113, which is a portion where there is copper foil, is not removed because the copper foil fulfills the role of a mask. This technique itself is publicly known as a "conformal process" method.

When a via hole has been formed in the manner described above, by performing appropriate panel plating processing and etching processing on the entire substrate, forming a 1-2 interlayer via hole 114 and an outer circuit pattern 115, a multilayer circuit board as shown in FIG. 14 is formed. Here, surface processing such as plating or a resist layer formed on the outer conducting surface, symbol printing, and the like are not shown in order to simplify the figures.

Other than a method as described above for producing a multilayer circuit board, there is also a method in which a plurality of 1-2 layer substrates, 3-4 layer substrates and the like are produced in a state in which the 2-3 interlayer via hole has been filled with resin (see FIG. 10), and a multilayer substrate is produced in a form with these substrates layered.

With the conventional multilayer circuit board described above, there are problems as stated below with respect to productivity and reliability. The primary cause of these problems is that there is a difference in the laser processing speed and laser processability for the processing laser beam between the various materials that constitute the inner insulating layer and the interlayer insulating layer. Below, such problems are described in detail.

The inner insulating layer and the interlayer insulating layer of the multilayer circuit board are ordinarily reinforced with fiberglass, polyimide fiber, or the like, with an object of insuring the dimensional stability, shape stability, and mechanical strength of the circuit board. However, in comparison to epoxy resin or the like used as the material of the inner insulating layer and the interlayer insulating layer, the laser processability of these reinforcing fibers is poor, so there is a large difference in the processing speed and in the quantity of energy necessary for processing. Thus, as shown in FIG. 16, fiber residue or an unprocessed material 301 remains in a via hole or through hole formed in the multilayer circuit board.

In order to address this problem, methods of improving the laser processability by pre-processing the reinforcing fiber or the like, and methods of designing the weave, thickness, and shape of the reinforcing fiber and the like, have been proposed (for example, see JP 2002-198653A, JP 2002-237680A, JP 2003-31957A, JP 2003-503832A, JP H11-195853A, JP H11-330310A, and JP 2004-146711A). However, these methods are imperfect, and there is the problem that preprocessing for these materials takes time and labor.

Further, the laser processing speed and the quantity of energy necessary for processing differs between the inner insulating layer and the interlayer insulating layer of the multilayer circuit board. Thus, for example, when the outer interlayer insulating layer requires irradiation of a laser beam with much greater energy than the inner insulating layer, laser irradiation on the outer interlayer insulating layer damages the inner insulating layer due to excessive energy.

For example, a 1-2-3 interlayer via hole 116 that connects one outer conducting layer and a pair of inner conducting layers is realized by connecting two via holes, a 1-2 interlayer via hole 114 that connects the one outer conducting layer and one of the inner conducting layers and the 2-3 interlayer inner via hole 106 that connects the pair of inner conducting layers, with a signal line of a secondary conducting layer 117 common to the two via holes. To form via holes that pass through or connect a plurality of layers of the multilayer circuit board, a process that forms a via hole in each layer and a process that fills the inner via hole with filling resin (see FIG. 10) is necessary, and the production process becomes extremely complicated.

Also, as shown in FIG. 15, because the surface of the substrate, in which the interlayer insulating layer 108 and the outer insulating layer 109 have been layered in the inner conducting layer on both sides of the substrate whose inner via holes are filled, is flat and smooth, path etching defects in the outer circuit shape in the above production process often occur.

Further, because it is difficult to stack a via hole on the same axis as an inner via hole, in the above production process it is necessary to form the 1-2 interlayer via hole 114 at a position slightly offset from the axis of the 2-3 interlayer inner via hole 106. With respect to this point, a "spiral via" method has been proposed in which, when it is desired that via holes are not offset from each other, the via holes are formed with their positions incrementally offset in a spiral shape. Also, with the object of improving wiring density and the like, methods have been proposed in which, conversely, via holes are formed on the same axis without filling (for example, see JP 2002-94240A, and JP 2002-237679A), and in which, after layering a plurality of layers without performing hole formation/via hole processing for layer units, holes are formed with a plurality of various depths in a single process (for example, see JP H10-224040A, JP H10-190235A, and JP H10-224041A).

As described above, in a conventional multilayer circuit board, differences in laser processing speed and laser processability of the processing laser beam between various materials that constitute the inner insulating layer and the interlayer insulating layer cause the problems of unprocessed material remaining in a via hole or a through hole, and damage to a layer of the multilayer circuit board due to excessive laser beam energy, affecting the reliability of the multilayer circuit board. Also, the production method of a conventional multilayer circuit board is complicated because, when forming a via hole that passes through or connects a plurality of layers, a process of forming a via hole in each layer unit is necessary. Further, in a multilayer circuit board formed with this production method, there are the problems that path etching defects occur easily, and via holes that pass through a plurality of layers cannot be formed on the same axis.

SUMMARY OF THE INVENTION

Accordingly, the present invention was made in order to address the problems described above, and it is an object thereof to provide a highly reliable multilayer circuit board in which the dimensional stability and shape stability of a printed circuit board is not impaired, and in which, by eliminating differences in laser processing speed and laser processability for the processing laser beam between various materials that constitute an inner insulating layer and an interlayer insulating layer, unprocessed material does not remain in a via hole or a through-hole. Also, it is a further object of the present invention to provide a production method for a multilayer circuit board in which a plurality of via holes and through holes that connect a plurality of layers on the same axis can be formed.

In order to achieve the above objects, in the multilayer circuit board according to the present invention, in which a plurality of circuit substrates configured by forming a circuit pattern on an insulating base material are stacked via an insulating layer, and a through-hole and a via hole are formed in the layering direction, laser processability and laser processing speed for a processing laser beam used in formation of the through-hole and the via hole are about the same for the insulating substrate material and the insulating layer.

Here, "about the same" means that when processing has been performed with the same processing conditions, for example, the difference in the depth of holes processed in two types of material subject to processing (for example, the inner insulating layer and the outer insulating layer) is within ±20 percent.

With this configuration, it is possible to select and set laser processing conditions suitable for removing all of the resin material or composite resin material that constitutes an inner insulating layer and an interlayer insulating layer or reinforcing fiber material included in the composite resin. Thus, fiber residue or a unprocessed material does not remain in a via hole or through-hole that has been laser-processed with those processing conditions.

Also, a configuration may be adopted in which, among the insulating base material and the insulating layer, the laser processability for the processing laser beam used in formation of the through-hole and the via hole is more outstanding for the insulating base material or the insulating layer at a position further inside (the inner layer side) relative to the layering direction, and laser processing speed is increased.

Thus, laser irradiation on the interlayer insulating layer furthest outside does not damage a further inside interlayer insulating layer and inner insulating layer due to excessive energy.

Also, hardened resin film may be used as the respective insulating layers in each of the multilayer circuit boards above.

In this case, a difference in hole depth caused by a difference in the number of layers in which via holes need to be connected, or in other words a difference in a hypothetical depth expressed by the product of the material thickness and laser processability, is reduced, and the necessity of making large changes in the laser processing conditions depending on hole depth is eliminated, so it is possible to perform processing under fixed conditions.

In a multilayer circuit board production method according to the present invention, which produces a multilayer circuit board in which a plurality of circuit substrates configured by forming a circuit pattern on an insulating base material are stacked via an insulating layer, and a through-hole and a via hole are formed in the layering direction, laser processability and laser processing speed for a processing laser beam used in formation of the through-hole and the via hole are about the same for the insulating substrate material and the insulating layer, and when forming the circuit pattern in each of the circuit substrates by etching, by removing a conducting layer in formation planned locations for the through-hole and the via hole by etching, and irradiating a laser beam on the formation planned locations after all layering processing is finished, all of the through-holes and via holes are formed collectively. Here, "formed collectively" means processing in one processing step. That is, it means that all of the holes have been formed at the point in time that processing has been finished after setting material in a laser processing device. Accordingly, another processing step does not enter in the midst of this processing step.

According to this sort of production method, with laser processing in a single process it is possible to form a via hole and a through-hole that connect a plurality of layers. Also, because fill processing for an inner via hole is unnecessary, and an interlayer insulating layer and conducting layer can be flatly and smoothly layered on an inner via hole, the possibility of path etching defects occurring is reduced when performing circuit formation on a conducting layer. Also, because it is not necessary to form a via hole and a through-hole in each layer, the positions of those holes are not offset from each other in each layer, and so it is possible to form the via hole and the through-hole on the same axis. As a result, the hole of the via hole and the through-hole can be made smaller, and further miniaturization can be achieved.

Also, a configuration may be adopted in which, in this production method, processing data for laser processing is sorted for each depth of the through-hole and the via hole in advance, and after setting processing conditions for each depth, laser processing is performed on the multilayer circuit board.

In this case, laser processing can be performed in a single process, so processing workability becomes more outstanding.

Also, with the production method of the present invention, unlike with a conventional method, fill processing is not necessary, so a great leap in productivity can be made. Also, to the extent that fill processing is not necessary, the surface of each conducting layer becomes flat and smooth, and there is no risk of etching defects occurring during circuit formation on a conducting layer.

Also, in the above production method, hardened resin film may be used for the insulating layer.

In this case, the difference in hole depth caused by the difference in the number of layers in which via holes need to be connected is reduced, and the necessity of making large changes in the laser processing conditions depending on hole depth is eliminated, so it is possible to perform processing under fixed conditions.

DESCRIPTION OF THE PREFERRED EMBODIMENTS

Below follows a detailed description of an embodiment of the present invention with reference to the accompanying figures.

Here, in order to simplify the following description, a 4-layer circuit board is adopted as an example, but the present invention is also applicable in a multilayer circuit board with three layers or five or more layers. Also, by adopting a structure in which an inner layer substrate (FPC) portion is pulled outside a multilayer layered portion, the present invention can also be made applicable to the production of a circuit board that is partially flexible, such as a folding-type or flying tail-type circuit board. Also, the description of the production method is substituted for a description of the multilayer circuit board itself.

FIGS. 1 to 5 are schematic cross-sectional views showing processes in an embodiment of a multilayer circuit board production method according to the present invention.

Figure 1:
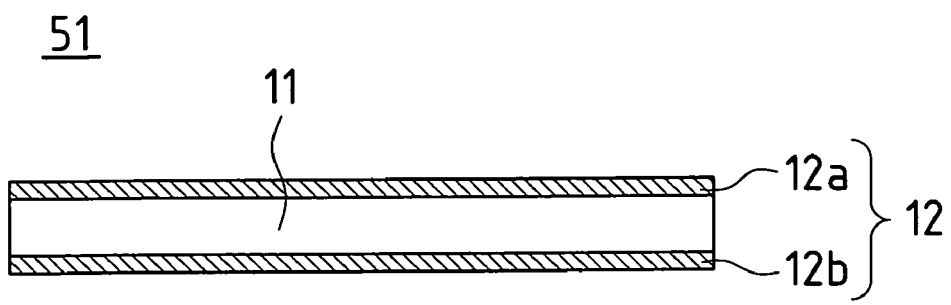
FIG. 1 is a schematic cross-sectional view showing a process in an embodiment of a multilayer circuit board production method according to the present invention.

First, as shown in FIG. 1, a layer substrate 51 with copper affixed to both faces, in which an inner conducting layer 12 configured from copper foil is layered on both faces of an insulating base material 11 (inner insulating layer) configured from a synthetic resin substrate, is prepared.

Here, a commercially available FPC base material in which copper foil is layered on both faces of the synthetic resin substrate 11 configured from polyimide film is used as the layer substrate 51, but instead, a material in which copper foil is layered on a synthetic resin substrate configured from material that has not been fiber-reinforced, such as epoxy film or acrylic film, can be used. Also, even if the synthetic resin substrate is configured from a composite material, material that does not include material that is difficult to process with a laser beam, such as fiberglass, or alternatively, various composite materials that include reinforced material whose laser processability is not much different from the base resin, such as paper or cellulose nonwoven reinforced material, may be used. Commercially available FPC material includes material in which copper foil is layered on a synthetic resin substrate via adhesive, and material in which copper foil is layered without using adhesive, but either may be used.

Figure 2:
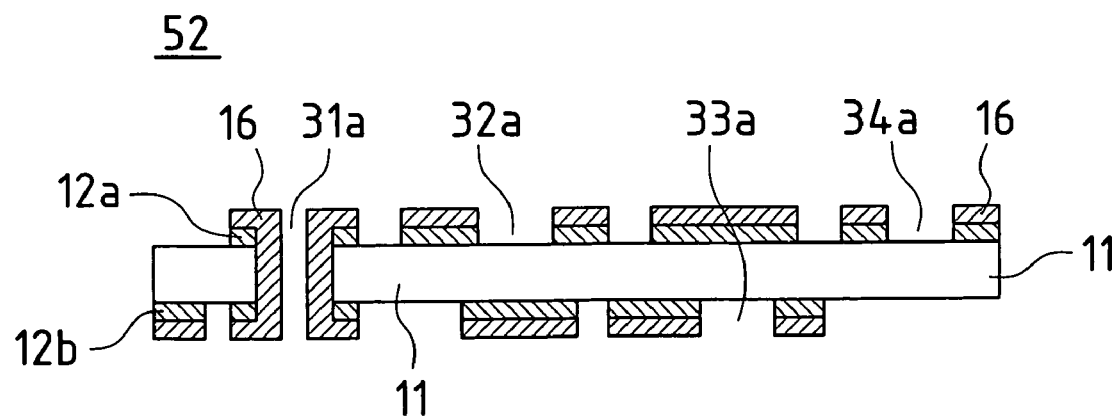
FIG. 2 is a schematic cross-sectional view showing a process in an embodiment of a multilayer circuit board production method according to the present invention.

Next, as shown in FIG. 2, in the layer substrate 51, a hole 31a, which is a 2-3 interlayer via hole that passes from an inner conducting layer 12a on one face of the layer substrate 51 through the inner insulating layer 11 and through an inner conducting layer 12b on the other face of the layer substrate 51, is formed. A metal plating layer 16 is formed by executing metal plating on the entire layer substrate 51 that includes the hole 31a.

Then, an inner circuit pattern is formed by an etching process. When doing so, the etching process is performed at a via hole formation planned location 32a, which in a state of completion becomes a 1-2-3 interlayer via hole 32 (see FIG. 5) that connects both the inner conducting layers 12a and 12b from an outer conducting layer 15a on the surface of one side of a complete circuit board; a via hole formation planned location 33a, which becomes a 4-3-2 interlayer via hole 33 (see FIG. 5) that connects both the inner conducting layers 12a and 12b from an outer conducting layer 15b on the surface of the other side of the complete circuit board; and a via hole formation planned location 34a, which becomes a 4-1 interlayer via hole 34 (see FIG. 5) that connects the outer conducting layers 15a and 15b on both sides of the complete circuit board; thus removing conductors in each of the formation planned locations 32a, 33a, and 34a, and thus completing an inner circuit pattern (see FIG. 2).

Supposing that a hole may be formed in a first layer and fourth layer of the outer conducting layers in the position of the 2-3 interlayer via hole 31, the conductor in the formation planned location may be removed, same as the above planned locations 32a, 33a, and 34a, without forming the hole 31a, which becomes the 2-3 interlayer via hole that passes through the inner conducting layers 12a and 12b on both sides of the layering substrate 51.

Figure 3:
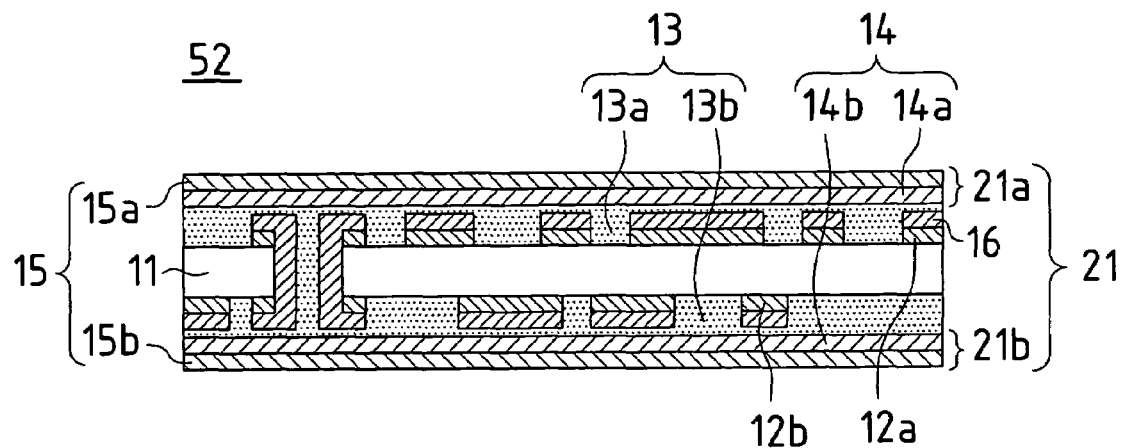
FIG. 3 is a schematic cross-sectional view showing a process in an embodiment of a multilayer circuit board production method according to the present invention.

Here, the hole 31a, which becomes the 2-3 interlayer via hole that passes through the inner conducting layers 12a and 12b on both sides of the layering substrate 51, may be filled in the same manner as in a conventional method, or alternatively, may be not filled at this point in time, and filled with an adhesive 13 for a next outer layer when the adhesive 13 is applied (see FIG. 3).

Next, as shown in FIG. 3, a pair of FPC base materials 21a and 21b with copper affixed to one face, in which an outer conducting layer 15 configured from copper foil has been layered on one face of an interlayer insulating layer 14 configured from synthetic resin substrate material, are respectively layered and adhered to both faces of a substrate 52 produced by the above process via adhesives 13a and 13b, in a form in which the interlayer insulating layers 14a and 14b of the FPC base materials 21a and 21b face the inner conducting layers 12a and 12b of the substrate 52. Here, it is possible to use epoxy adhesive as the adhesive 13, and to use a synthetic resin substrate configured from polyimide base film as the synthetic resin substrate of the interlayer insulating layer 14 of the FPC substrate 21 with copper affixed to one side. Also, the synthetic resin substrate material of the interlayer insulating layer 14 of the FPC substrate base material 21 with copper affixed to one side, same as the material of the layer substrate material 51 that becomes an inner layer described above, may be configured from synthetic resin substrate material that is not fiber-reinforced such as epoxy film or acrylic film. Also, a synthetic resin substrate configured from a composite material like the material of the layer substrate material 51 that becomes an inner layer may be used, or alternatively, a synthetic resin substrate configured from a composite material may be used if it is material that does not include material that is difficult to process with a laser beam such as fiberglass, or various composite materials including reinforced material that does not have a large difference with respect to the base resin and laser processability, such as paper or cellulose nonwoven reinforced material, may be used. Further, material in which copper foil has been layered on the synthetic resin substrate material via adhesive, or alternatively, material in which copper foil has been layered without using adhesive, may be used.

In order to preserve dimensional and shape stability, it is preferable to select the same material for the synthetic resin substrate material of the interlayer insulating layer 14 and the above adhesive 13, as is selected for the synthetic resin substrate material that becomes the inner insulating layer 11, but a material that differs from the synthetic resin substrate material that becomes the inner insulating layer 11 may be used if the material has the same or a slightly slower laser processing speed than the synthetic resin substrate material that becomes the inner insulating layer 11.

Figure 4:
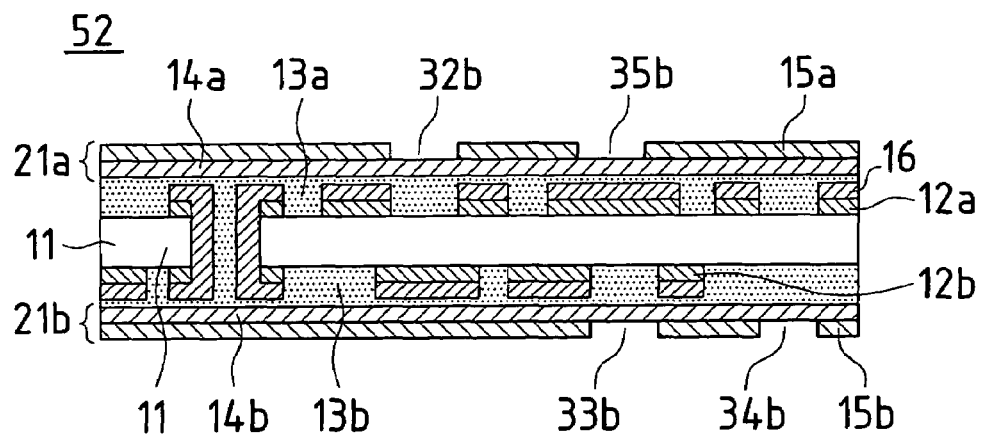
FIG. 4 is a schematic cross-sectional view showing a process in an embodiment of a multilayer circuit board production method according to the present invention.

In the substrate produced with the above process, with a conventionally known method, if necessary, along with forming holes that pass through that substrate, as shown in FIG. 4, etching is performed to remove the outer copper foil of a portion 32b that becomes a 1-2-3 interlayer via hole 32 (see FIG. 5) from the outer conducting layer 15a on one face of the substrate to both the inner conductor 12a and 12b, the outer copper foil of a portion 33b that becomes a 4-3-2 interlayer via hole 33 (see FIG. 5) from the outer conducting layer 15b on the other side of the substrate to both the inner conductor 12a and 12b, the outer copper foil of a portion 34b that becomes a 4-1 interlayer via hole 34 (see FIG. 5) from the outer conducting layer 15b on one side to the outer conducting layer 15a on the other side, and the outer copper foil of a portion 35b that becomes a 1-2 interlayer via hole 35 (see FIG. 5) from the outer conducting layer 15a on one face of the substrate to the inner conducting layer 12a on one side. When forming the interlayer circuits, the 1-2-3 interlayer via hole formation planned location 32b, the 4-3-2 interlayer via hole formation planned location 33b, and the 4-1 interlayer via hole formation planned location 34b, are set on the same axis as the 1-2-3 interlayer via hole formation planned location 32a, the 4-3-2 interlayer via hole formation planned location 33a, and the 4-1 interlayer via hole formation planned location 34a in which the inner conducting layer has been removed.

Figure 5:
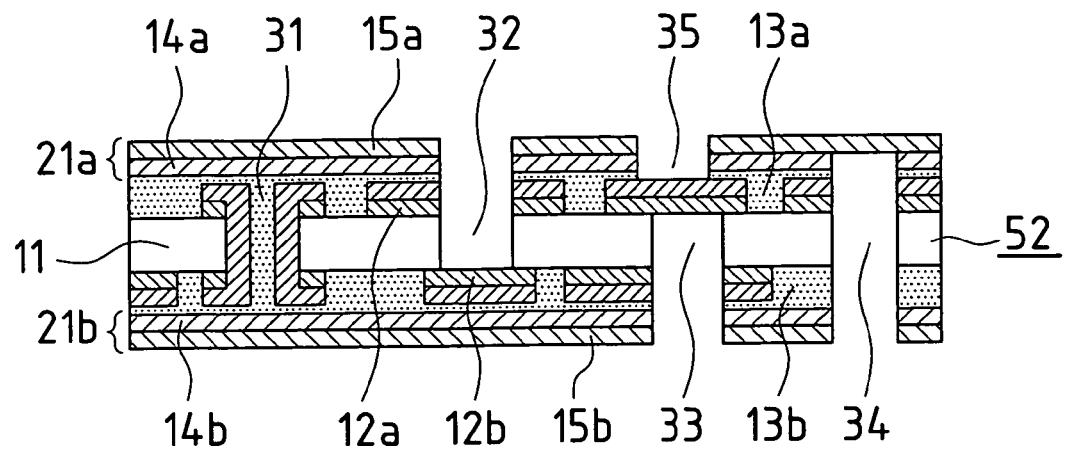
FIG. 5 is a schematic cross-sectional view showing a process in an embodiment of a multilayer circuit board production method according to the present invention.
Figure 6:
FIG. 6 is a schematic cross-sectional view showing a process in a conventional multilayer circuit board production method.
Figure 7:
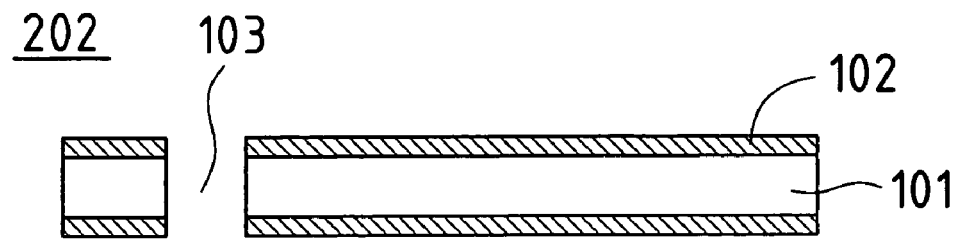
FIG. 7 is a schematic cross-sectional view showing a process in a conventional multilayer circuit board production method.
Figure 8:
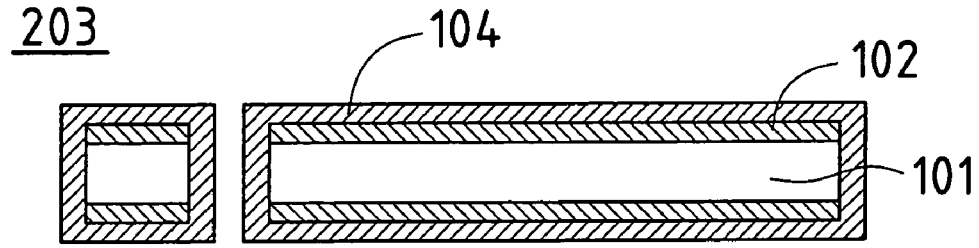
FIG. 8 is a schematic cross-sectional view showing a process in a conventional multilayer circuit board production method.
Figure 9:
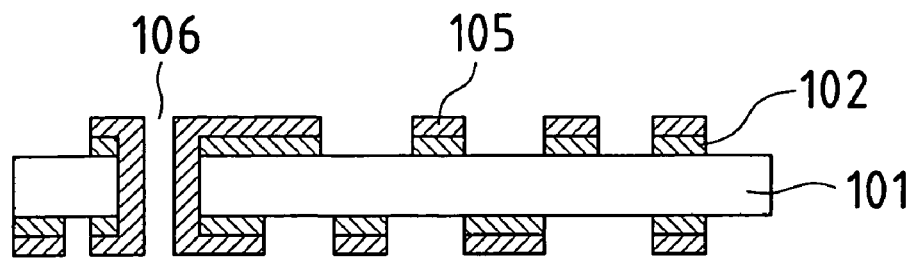
FIG. 9 is a schematic cross-sectional view showing a process in a conventional multilayer circuit board production method.
Figure 10:
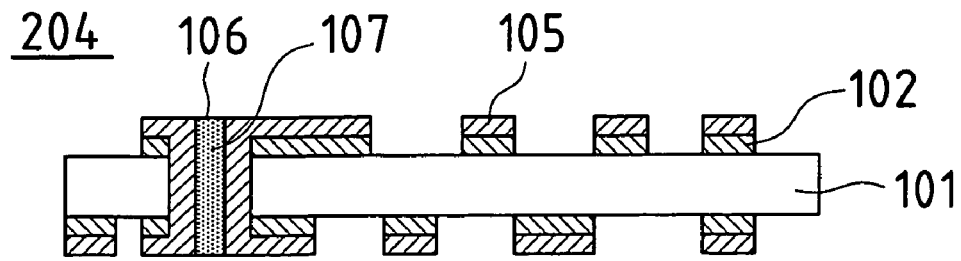
FIG. 10 is a schematic cross-sectional view showing a process in a conventional multilayer circuit board production method.
Figure 11:
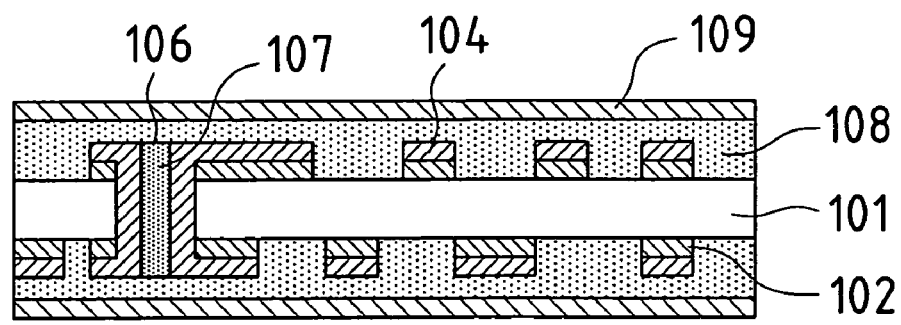
FIG. 11 is a schematic cross-sectional view showing a process in a conventional multilayer circuit board production method.
Figure 12:
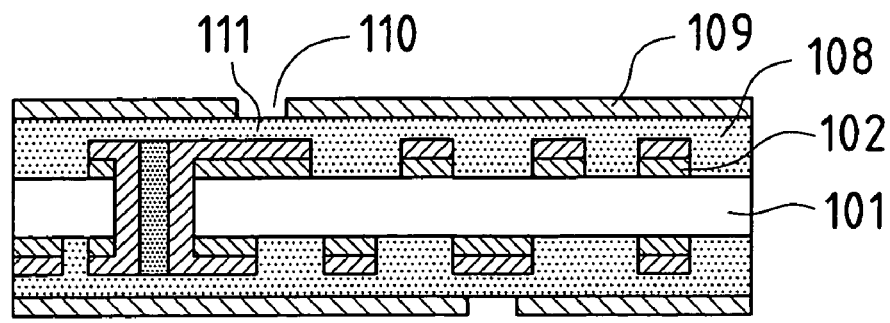
FIG. 12 is a schematic cross-sectional view showing a process in a conventional multilayer circuit board production method.
Figure 13:
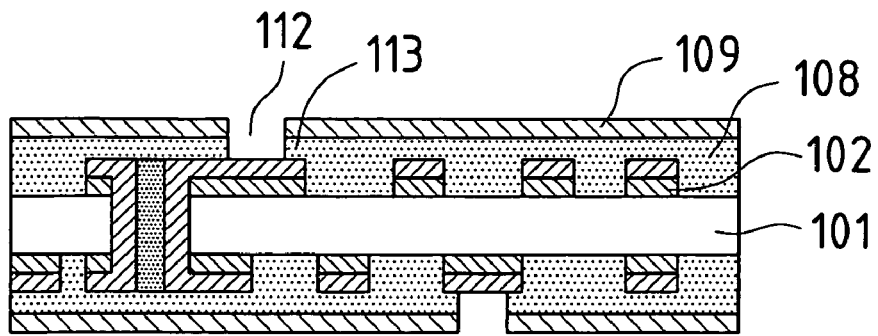
FIG. 13 is a schematic cross-sectional view showing a process in a conventional multilayer circuit board production method.
Figure 14:
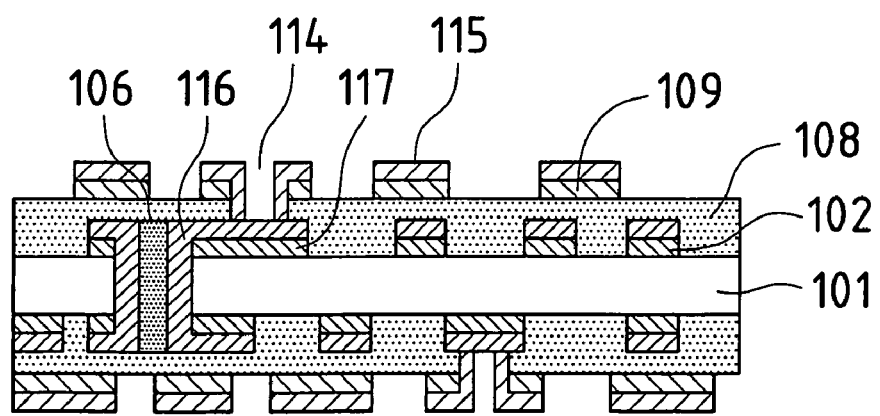
FIG. 14 is a schematic cross-sectional view showing a process in a conventional multilayer circuit board production method.
Figure 15:
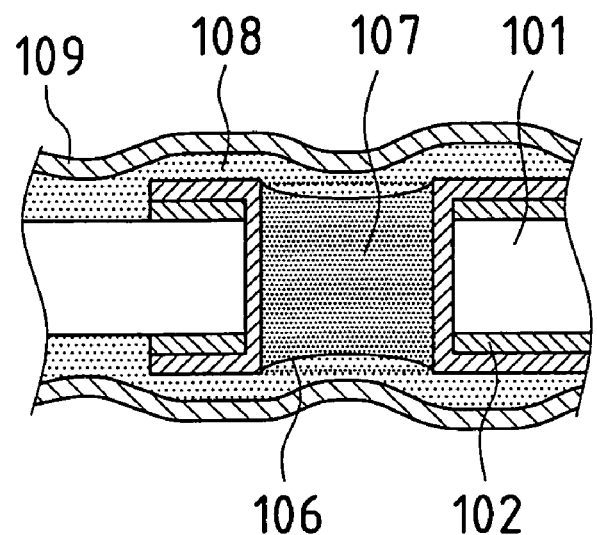
FIG. 15 is an enlarged schematic cross-sectional view for illustrating problems in a filled portion of a conventional multilayer circuit board.
Figure 16:
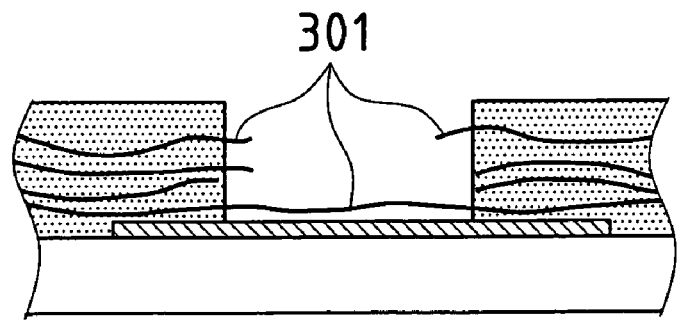
FIG. 16 is an enlarged schematic cross-sectional view for illustrating problems in a portion of a conventional multilayer circuit board in which a hole has been formed.

Next, with respect to the circuit board formed by passing through all of the above processes, when a processing laser beam is irradiated from the upper face or alternatively the lower face of the circuit board to the portion where the copper foil was removed, i.e., irradiated on each via hole formation planned location 32b, 33b, 34b, and 35b, the resin of the locations that are not covered with copper foil is removed, collectively forming the 1-2-3 interlayer via hole 32, the 4-3-2 interlayer via hole 33, the 4-1 interlayer via hole 34, and the 1-2 interlayer via hole 35 (see FIG. 5).

With respect to the structure of the circuit board formed with the production method described above, because the thicknesses of the inner insulating layer 11 and the interlayer insulating layer 14 are less than with a conventional configuration, there is little difference in depth between via holes. This is due to the material used for the inner insulating layer 11 and the interlayer insulating layer 14. That is, conventionally, because prepreg material, which is a composite material of semi-hardened resin and reinforcing fiber, is used for the material of the inner insulating layer and the interlayer insulating layer in order to preserve interlayer insulating properties and to preserve dimensional and shape stability, the thickness of the inner insulating layer and the interlayer insulating layer is 0.1 mm or more. On the other hand, according to the present invention, thin polyimide film that has already hardened and is stable is used for the inner insulating layer 11 and the interlayer insulating layer 14, and so it is possible for the thickness of the interlayer insulating layer 14 to be made 25 µm or less while preserving interlayer insulating properties and dimensional and shape stability. As a result, via hole depth, i.e., the hole depth required to be opened with laser processing, is much less than with a conventional configuration, and so the difference in hole depth caused by the difference in the number of layers in which via holes need to be connected also is reduced. Thus, because the difference in hole depth is small, in the present invention, the necessity of making large changes in the processing conditions for laser processing due to hole depth is eliminated.

Next, a multilayer circuit board according to the present invention actually formed with the method described above was compared to a multilayer circuit board actually formed with the described conventional method. The results of that comparison are shown in the following table.

TABLE 1

|  | Conventional Method | Present Embodiment |
|---|---|---|
| interlayer insulating layer thickness (including adhesive) | 0.1 mm | 0.025 mm |
| conductor thickness | 0.025 mm | 0.018 mm |
| 1-2 interlayer via hole depth | 0.1 mm | 0.025 mm |
| 1-3 interlayer via hole depth | 0.225 mm | 0.075 mm |
| difference in hole depth | 0.125 mm | 0.05 mm |

As is clear from the above results, as stated above, along with using material with about the same laser processing speed and processability as the synthetic resin material used for the inner insulating layer and the interlayer insulating layer, thin polyimide film that has already hardened and is stable is used, and so the difference in the depth of each via hole is less than in a conventional multilayer circuit board. Accordingly, because the laser processability of the inner insulating layer and the interlayer insulating resin layer processed with a laser beam is that much better, basically, a plurality of holes can be formed in a single process with fixed process conditions or by making only very small adjustments to the process conditions.

Also, it is possible to change the laser processing conditions depending on the hole depth. For example, the processing time of the 1-3 layer via hole, i.e., the number of laser pulses fired at the same position or the dwell time may be changed to, for example, two times or 1.5 times that of the 1-2 layer via hole. Also, when doing so, if processing hole data is sorted in advance for each depth, and process conditions are collectively set, productivity can be further improved.

After via holes are formed by passing through all of the processing described above, same as with the conventional method, panel plating, outer pattern formation, formation of plating, solder resists, and symbols, and external shaping are performed, resulting in a complete substrate.

The present invention may be embodied in various other forms without departing from the gist or essential characteristics thereof. The embodiments disclosed in this application are to be considered in all respects as illustrative and not limiting. The scope of the invention is indicated by the appended claims rather than by the foregoing description, and all modifications or changes that come within the meaning and range of equivalency of the claims are intended to be embraced therein.

What is claimed is:

1. A multilayer circuit board comprising:
a plurality of circuit substrates each forming a circuit pattern; an insulating base material having a first one of the circuit substrates formed thereon; an insulating layer positioned between the first one of the circuit substrates and a second one of the circuit substrates; and a through-hole and a blind via hole formed in the multilayer circuit board in the layering direction, wherein the insulating base material and the insulating layer are formed of materials that have similar characteristics of speed of processing by a laser beam used in formation of the through-hole and the blind via hole and quantity of energy necessary for the processing by the laser beam, said characteristics of the materials allowing the through-hole and the blind via hole to be formed free of fiber residue and unprocessed material when processed by the laser beam.

2. A multilayer circuit board comprising: a plurality of circuit substrates each forming a circuit pattern; an insulating base material having a first one of the circuit substrates formed thereon; and an insulating layer positioned between the first one of the circuit substrates and a second one of the circuit substrates; and a through-hole and a blind via hole formed in the multilayer circuit board in the layering direction, wherein characteristics of speed of processing by a processing laser beam used in formation of the through-hole and the blind via hole and quantity of energy necessary for processing by the processing laser beam, are greater for a material forming an inner layer constituting the insulating base material or the insulating layer than the same characteristics for a material forming an outer layer respectively constituting the insulating layer or another insulating layer, said characteristics of the materials allowing the through-hole and blind via hole to be formed free of fiber residue and unprocessed material.

3. The multilayer circuit board according to claim 1, wherein hardened resin film is used as the insulating layer.

4. A method of producing a multilayer circuit board, the method comprising: forming on an insulating base material a first one of a plurality of circuit substrates, the circuit substrates each forming a circuit pattern; removing conducting portions of the first circuit substrate in first predetermined locations corresponding to a through-hole and a blind via hole; forming an insulating layer on the first circuit substrate; forming on the insulating layer a second one of the circuit substrates; removing conducting portions of the second circuit substrate in second predetermined locations corresponding to the through-hole and the blind via hole; and after the conducting portions of the second circuit substrate are removed, collectively irradiating with a laser beam at least the first and second predetermined locations to form the through-hole and the blind via hole in the layering direction, wherein materials respectively forming the insulating base material and the insulating layer have similar characteristics of speed of processing by the laser beam used in formation of the through-hole and the via hole and quantity of energy necessary for processing by the laser beam, said characteristics of the materials allowing the through-hole and the blind via hole to be formed free of fiber residue and unprocessed material when processed by the laser beam.

5. A method of producing a multilayer circuit board, the method comprising: forming on an insulating base material a first one of a plurality of circuit substrates, the circuit substrates each forming a circuit pattern; removing conducting portions of the first circuit substrate in first predetermined locations corresponding to a through-hole and a blind via hole; forming an insulating layer on the first circuit substrate; forming on the insulating layer a second one of the circuit substrates; removing conducting portions of the second circuit substrate in second predetermined locations corresponding to the through-hole and the blind via hole; and after the conducting portions of the second circuit substrate are removed, collectively irradiating with a laser beam at least the first and second predetermined locations to form the through-hole and the blind via hole in the layering direction, wherein characteristics of speed of processing by the laser beam and quantity of energy necessary for processing by the laser beam are greater for a material forming an inner layer constituting the insulating base material or the insulating layer than the same characteristics for a material forming an outer layer respectively constituting the insulating layer or another insulating layer, said characteristics of the materials allowing the through-hole and the blind via hole to be formed free of fiber residue and unprocessed material.

6. The multilayer circuit board production method according to claim 4 or 5, wherein processing data for laser processing is sorted for each depth of the through-hole and the blind via hole in advance, and after setting processing conditions for each depth, processing by the laser is performed on the multilayer circuit board.

7. The multilayer circuit board production method according to claim 4 or 5, wherein the insulating layer is hardened resin film.

8. The multilayer circuit board production method according to claim 6, wherein the insulating layer is hardened resin film.

9. The multilayer circuit board according to claim 2, wherein hardened resin film is used as the insulating layer.

10. The multilayer circuit board according to one of claims 1, 2, 4, and 5, wherein the insulating base material is formed from a different material than material that forms the insulating layer.

11. The multilayer circuit board according to claim 1 or 2, wherein at least one of the insulating base material and the insulating layer includes reinforcing fibers.

12. The multilayer circuit board according to claim 1 or 2, wherein the insulating base material comprises polyimide film.

* * * * *